United States Patent
Zhang et al.

(10) Patent No.: US 9,570,629 B2
(45) Date of Patent: Feb. 14, 2017

(54) THIN FILM TRANSISTOR, ARRAY SUBSTRATE AND METHOD OF FABRICATING THE SAME, AND DISPLAY DEVICE

(71) Applicants: BOE Technology Group Co., Ltd., Beijing (CN); Beijing BOE Optoelectronics Technology Co., Ltd., Beijing (CN)

(72) Inventors: Jiaxiang Zhang, Beijing (CN); Jian Guo, Beijing (CN); Xiaohui Jiang, Beijing (CN)

(73) Assignees: BOE TECHNOLOGY GROUP CO., LTD., Beijing (CN); BEIJING BOE OPTOELECTRONICS, Beijing (CN)

( * ) Notice: Subject to any disclaimer, the term of this patent is extended or adjusted under 35 U.S.C. 154(b) by 168 days.

(21) Appl. No.: 14/400,128

(22) PCT Filed: Dec. 4, 2013

(86) PCT No.: PCT/CN2013/088516
§ 371 (c)(1),
(2) Date: Nov. 10, 2014

(87) PCT Pub. No.: WO2015/024325
PCT Pub. Date: Feb. 26, 2015

(65) Prior Publication Data
US 2016/0268443 A1   Sep. 15, 2016

(30) Foreign Application Priority Data

Aug. 20, 2013 (CN) .......................... 2013 1 0364369

(51) Int. Cl.
*H01L 29/10* (2006.01)
*H01L 29/786* (2006.01)
(Continued)

(52) U.S. Cl.
CPC ....... *H01L 29/78696* (2013.01); *H01L 27/124* (2013.01); *H01L 27/127* (2013.01);
(Continued)

(58) Field of Classification Search
CPC ........... H01L 29/78696; H01L 27/1225; H01L 27/124; H01L 27/127; H01L 29/124; H01L 29/78606; H01L 29/78618; H01L 29/7869; H01L 2924/0002; H01L 2924/00; H01L 27/1214
See application file for complete search history.

(56) References Cited

U.S. PATENT DOCUMENTS 5,793,072 A *  8/1998  Kuo ................... H01L 29/6675
                                                              257/241
2010/0225609 A1 *  9/2010  Huang ................ G02F 1/13338
                                                              345/173
(Continued)

FOREIGN PATENT DOCUMENTS

CN       101271903 A        9/2008
CN       102184968 A *      9/2011    ....... H01L 29/41733

OTHER PUBLICATIONS

Notification of the First Office Action from the Chinese Patent Office (SIPO) for priority Chinese application 201310364369.6, mailed Aug. 3, 2015 with English translation.
(Continued)

*Primary Examiner* — Yosef Gebreyesus
(74) *Attorney, Agent, or Firm* — Frommer Lawrence & Haug LLP

(57) ABSTRACT

The embodiments of the present invention provide a thin film transistor including a gate, an upper active layer, a lower active layer, an upper source, a lower source, an upper drain and a lower drain. The upper active layer and the lower active layer are disposed at an upper side and a lower side of the gate, respectively, the lower source and the lower
(Continued)

drain are connected to the lower active layer, respectively, and the upper source and the upper drain are connected to the upper active layer, respectively. The embodiments of the present invention also provide an array substrate including the thin film transistor, a method of fabricating the array substrate, and a display device including the array substrate.

19 Claims, 4 Drawing Sheets

(51) Int. Cl.
      *H01L 29/417*     (2006.01)
      *H01L 29/423*     (2006.01)
      *H01L 27/12*      (2006.01)
      *H01L 29/24*      (2006.01)

(52) U.S. Cl.
     CPC .......... *H01L 27/1225* (2013.01); *H01L 29/24* (2013.01); *H01L 29/41733* (2013.01); *H01L 29/42384* (2013.01); *H01L 29/7869* (2013.01); *H01L 29/78606* (2013.01); *H01L 29/78618* (2013.01)

(56) References Cited

U.S. PATENT DOCUMENTS

| 2012/0146713 | A1 | 6/2012 | Kim et al. |
| 2012/0299000 | A1 | 11/2012 | Choo et al. |
| 2013/0146931 | A1* | 6/2013 | Liu .................... H01L 27/0688 257/99 |

OTHER PUBLICATIONS

International Search Reportand Written Opinion from SIPO for international application PCT/CN2013/088516 mailed May 27, 2014 with English translation of Written Opinion.

* cited by examiner

THIN FILM TRANSISTOR, ARRAY SUBSTRATE AND METHOD OF FABRICATING THE SAME, AND DISPLAY DEVICE

This application is a 371 of PCT/CN2013/088516 filed on Dec. 4, 2013, which claims priority benefits from Chinese Patent Application Number 201310364369.6 filed Aug. 20, 2013, the disclosure of which is incorporated herein by reference.

FIELD OF THE INVENTION

The embodiments of the present invention relates to the field of display technology, and more particularly, to a thin film transistor, an array substrate including the thin film transistor, a method of fabricating the array substrate, and a display device including the array substrate.

BACKGROUND OF THE INVENTION

An array substrate is an important component of a display device, and includes at least a data line, a gate line, a thin film transistor and a pixel electrode. FIG. 1 illustrates a conventional thin film transistor, including a source 1, a drain 2, a gate 3 and an active layer 4. The data line is connected to the source 1 of the thin film transistor, the gate line 5 is connected to the gate 3 of the thin film transistor, the drain 2 is connected to the pixel electrode 6, and the pixel electrode 6 is charged by the thin film transistor. The stronger charging capability the thin film transistor has, the shorter charging time becomes, and thereby the better display effect is obtained.

With people's increasing demand on display quality of the display device, the number of pixel units in the array substrate is required to be increased, so as to improve the resolution of the display device. The larger the number of the pixel units is, the longer the charging time becomes. Consequently, the charging efficiency of the thin film transistor is increasingly required to be improved, and the charging time of the thin film transistor is increasingly required to be reduced.

SUMMARY OF THE INVENTION

An object of the embodiments of the present invention is to provide a thin film transistor, an array substrate including the thin film transistor, a method of fabricating the array substrate, and a display device including the array substrate. With the thin film transistor, the time required to charge the pixel electrode can be reduced, which allows the array substrate to include more pixel units, thereby improving the resolution of the display device.

In order to achieve the above object, according to one aspect of the embodiments of the present invention, there is provided a thin film transistor including a gate. The thin film transistor further includes an upper active layer, a lower active layer, an upper source, a lower source, an upper drain and a lower drain. The upper active layer and the lower active layer are disposed at an upper side and a lower side of the gate, respectively, the lower source and the lower drain are connected to the lower active layer, respectively, and the upper source and the upper drain are connected to the upper active layer, respectively.

The upper source may be connected to the lower source through a first via hole, and the upper drain may be connected to the lower drain through a second via hole.

An upper gate insulation layer may be provided between the upper active layer and the gate, and a lower gate insulation layer may be provided between the lower active layer and the gate.

The thin film transistor may further include a protective layer that covers the upper active layer, the upper source and the upper drain are disposed on the protective layer, and the upper source is connected to the upper active layer through a third via hole, and the upper drain is connected to the upper active layer through a fourth via hole.

According to another aspect of the embodiments of the present invention, there is provided an array substrate, including a plurality of pixel units divided by a plurality of data lines and a plurality of gate lines, a thin film transistor and a pixel electrode connected to the thin film transistor being provided in each of the pixel units. The thin film transistor is the thin film transistor according to the above mentioned aspect of the embodiments of the present invention. The pixel electrode is electrically connected to both the upper drain and the lower drain, and the data line is electrically connected to both the upper source and the lower source.

The upper drain and the upper source may be made of a same material as the pixel electrode.

According to yet another aspect of the present invention, there is provided a display device including an array substrate, the array substrate is the array substrate according to the above mentioned aspect of the embodiments of the present invention.

According to still another aspect of the present invention, there is provided a method of fabricating an array substrate, including steps of: forming a pattern comprising a lower source and a lower drain;

forming a pattern comprising a lower active layer;

forming a pattern comprising a gate;

forming a pattern comprising an upper active layer;

forming a pattern comprising an upper source and an upper drain; and forming a pattern comprising a pixel electrode, the pixel electrode being electrically connected to both the lower drain and the upper drain.

The step of forming the pattern comprising the upper source and the upper drain and the step of forming the pattern comprising the pixel electrode may be performed simultaneously, so that the upper source and the upper drain are made of the same material as the pixel electrode.

Before the step of forming the pattern comprising the upper source and the upper drain, the method may further include a step of forming a first via hole and a second via hole, so that the upper source is connected to the lower source through the first via hole, and the upper drain is connected to the lower drain through the second via hole.

After the step of forming the pattern comprising the upper active layer, and before the step of forming the pattern comprising the upper source and the upper drain, the method may further include a step of forming a protective layer that covers the upper active layer.

After the step of forming the protective layer, and before the step of forming the pattern comprising the upper source and the upper drain, the method may further include a step of forming a third via hole and a fourth via hole in the protective layer, so that the upper source is connected to the upper active layer through the third via hole, and the upper drain is connected to the upper active layer through the fourth via hole.

After the step of forming the protective layer, and simultaneously with the step of forming the third via hole and the fourth via hole in the protective layer, the method may further include a step of forming a first via hole and a second via hole, so that the upper source is connected to the lower source through the first via hole, and the upper drain is connected to the lower drain through the second via hole.

After the step of forming the pattern comprising the lower active layer, and before the step of forming the pattern comprising the gate, the method may further include a step of forming a lower gate insulation layer. After the step of forming the pattern comprising the gate, and before the step of forming the pattern comprising the upper active layer, the method may further include a step of forming an upper gate insulation layer.

When the thin film transistor according to the embodiments of the present invention is applied to the array substrate, the upper source and the lower source are both connected to the data line of the array substrate, and the upper drain and the lower drain are both connected to the pixel electrode. When the array substrate is powered, the signal from the data line is transmitted via the upper active layer and the lower active layer, which is equivalent to the fact that two general thin film transistors simultaneously charge the pixel electrode. Accordingly, the thin film transistor according to the present invention has relatively high charging capability, so that the time required to charge the pixel electrode can be reduced and thus the display effect of the display device utilizing the thin film transistor can be improved.

BRIEF DESCRIPTION OF THE DRAWINGS

The drawings which constitute a part of the description are used for providing further understanding of the embodiments of the present invention and for explaining the embodiments of the present invention in conjunction with the following implementations, but not for limiting the present invention. In the drawings.

DESCRIPTION OF THE PREFERRED EMBODIMENT

Hereinafter, the embodiments of the present invention will be described in detail with reference to the accompanying drawings. It should be understood that the embodiments described herein are only the exemplary embodiments employed for illustrating and explaining the principle of the present invention, but the present invention is not limited thereto.

It is noted that all the terms "upper", "above", "lower" and "below" used in the embodiments of the present invention are described relative to the direction shown in FIG. 2.

Figure 1:
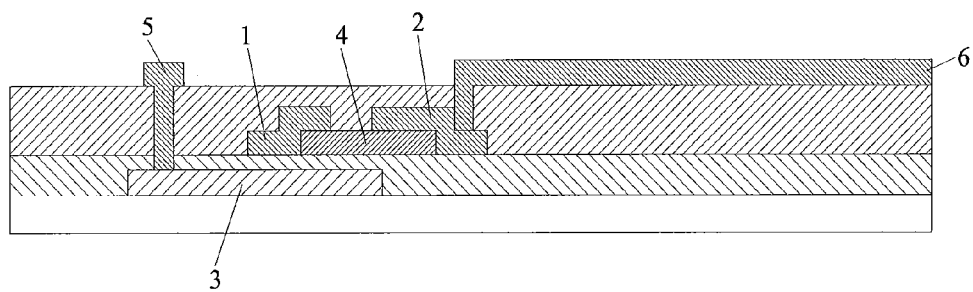
FIG. 1 is a cross-sectional view of a thin film transistor in the prior art.
Figure 2:
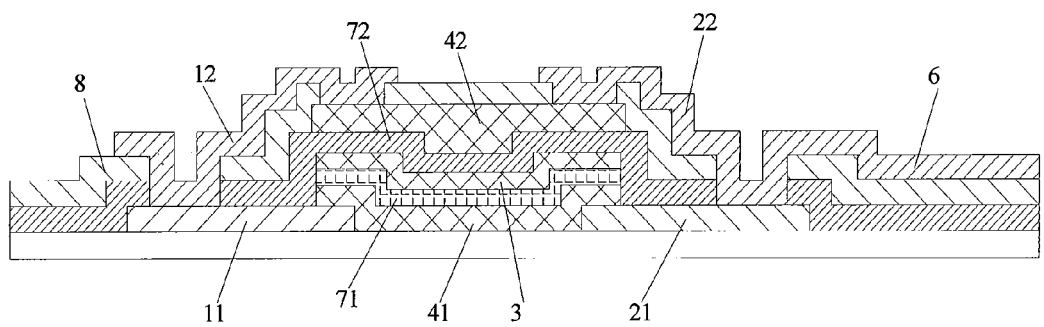
FIG. 2 is a cross-sectional view of a thin film transistor according to the embodiments of the present invention.
Figure 3:
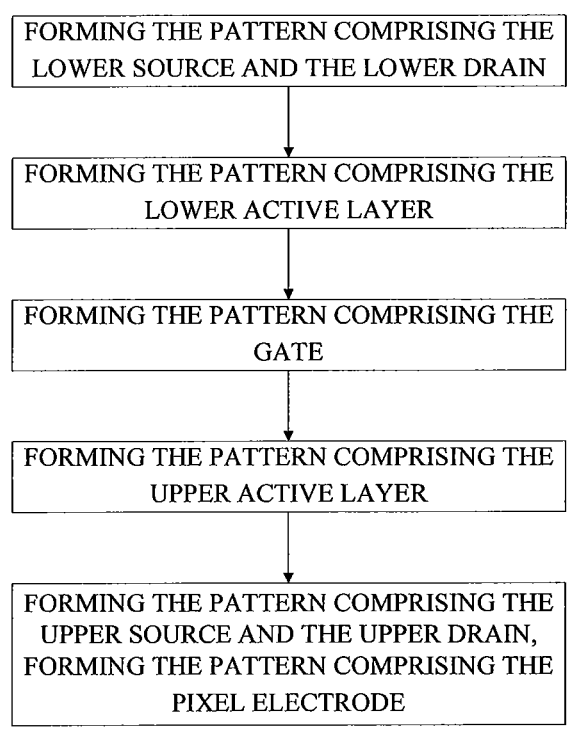
FIG. 3 is a flow chart illustrating a method of fabricating an array substrate according to the embodiments of the present invention.

According to one aspect of the embodiments of the present invention, as shown in FIG. 2, there is provided a thin film transistor including a gate 3. In addition, the thin film transistor further includes an upper active layer 42, a lower active layer 41, an upper source 12, a lower source 11, an upper drain 22 and a lower drain 21. The upper active layer 42 and the lower active layer 41 are disposed at an upper side and a lower side of the gate 3, respectively. The lower source 11 and the lower drain 21 are connected to the lower active layer 41, respectively. The upper source 12 and the upper drain 22 are connected to the upper active layer 42, respectively. The thin film transistor according to the embodiments of the present invention is equivalent to two general thin film transistors, that is, the upper source 12, the upper active layer 42, the upper drain 22 and the gate 3 form one thin film transistor, while the lower source 11, the lower active layer 41, the lower drain 21 and the gate 3 form another thin film transistor.

When the thin film transistor according to the embodiments of the present invention is applied to an array substrate, the upper source 12 and the lower source 11 are both connected to a data line (not illustrated) of the array substrate, and the upper drain 22 and the lower drain 21 are both connected to a pixel electrode 6. When the array substrate is powered, the signal from the data line is transmitted via two paths of the upper active layer 42 and the lower active layer 41, respectively, which is equivalent to the fact that the two general thin film transistors simultaneously charge the pixel electrode 6. As can be seen from the above, the thin film transistor according to the present invention has relatively high charging capability, so that the time required to charge the pixel electrode can be reduced and the display effect of the display device utilizing the thin film transistor can be improved.

The upper source 12 and the lower source 11 may be electrically connected to the data line of the array substrate, respectively, and the upper drain 22 and the lower drain 21 may be electrically connected to the pixel electrode 6, respectively. In order to simplify the structure of the thin film transistor, typically as shown in FIG. 2, the upper source 12 may be connected to the lower source 11 by a first via hole, so that the data line of the array substrate may be electrically connected to the lower source 11, and may be also electrically connected to the upper source 12 through the first via hole. Similarly, the upper drain 22 may be connected to the lower drain 21 by a second via hole, so that the pixel electrode 6 may be electrically connected to the upper drain 22, and may be also electrically connected to the lower drain 21 through the second via hole.

In order to reduce parasitic capacitance, for example, an upper gate insulation layer 72 may be disposed between the upper active layer 42 and the gate 3, and a lower gate insulation layer 71 may be disposed between the lower active layer 41 and the gate 3. For example, the upper gate insulation layer 72 and the lower gate insulation layer 71 may be formed by use of $SiO_2$.

The thin film transistor according to the embodiments of the present invention may further include a protective layer 8. The protective layer 8 is disposed above the upper active layer 42, the upper source 12 and the upper drain 22 are disposed on the protective layer 8, the upper source 12 is connected to the upper active layer 42 through a third via hole, and the upper drain 22 is connected to the upper active layer 42 through a fourth via hole.

The function and effect of the protective layer 8 are similar to those of a protective layer in the thin film transistor in the prior art, and description thereto will be omitted herein.

It should be appreciated that, the first via hole and the second via hole may penetrate the upper gate insulation layer 72 and/or the protective layer 8, that is, the upper gate insulation layer 72 and/or the protective layer 8 may extend to cover the upper sides of the lower source 11 and the lower drain 21. Further, the third via hole and the fourth via hole may penetrate the protective layer 8.

In the embodiment shown in FIG. 2, the lower source 11 and the lower drain 21 are disposed at two sides of the lower active layer 41, respectively, a part of the lower active layer 41 is lapped over a part of the lower source 11, and another part of the lower active layer 41 is lapped over a part of the lower drain 21, so that the lower source 11 and the lower drain 21 are connected to the lower active layer 41, respectively. The upper source 12 and the upper drain 22 are disposed at two sides of the upper active layer 42, and the upper source 12 and the upper drain 22 are respectively connected to the upper active layer 42 through the via holes provided in the protective layer which is disposed above the upper active layer 42.

According to another aspect of the embodiments of the present invention, there is provided an array substrate including a plurality of pixel units defined by a plurality of data lines and a plurality of gate lines dividing the array substrate. A thin film transistor and a pixel electrode 6 connected thereto are provided in each of the pixel units, wherein the thin film transistor is the thin film transistor provided in the above mentioned embodiment of the present invention, the pixel electrode 6 is electrically connected to both the upper drain 22 and the lower drain 21, and the data line is electrically connected to both the upper source 12 and the lower source 11.

As described above, when the array substrate according to the embodiments of the present invention is powered, it is equivalent to the fact that two general thin film transistors simultaneously charge the pixel electrode 6. Accordingly, the thin film transistor according to the present invention has relatively high charging capability, so that the time required to charge the pixel electrode can be reduced. Accordingly, the array substrate according to the embodiments of the present invention can have more pixel units, so that the display device utilizing the array substrate according to the embodiments of the present invention may achieve high resolution, thereby improving the display effect of the display device.

For example, the upper drain 22 and the upper source 12 may be made of the same material as the pixel electrode 6. In other words, the upper drain 22, the upper source 12 and the pixel electrode 6 are located at the same layer. Consequently, the upper drain 22, the upper source 12 and the pixel electrode 6 may be formed in the same patterning process, which will be described later.

According to another aspect of the embodiments of the present invention, there is provided a display device including an array substrate, wherein the array substrate is the array substrate provided in the above mentioned embodiment of the present invention.

As described above, the array substrate according to the embodiments of the present invention can have more pixel units, so that the display device may have high resolution, thereby improving the display effect of the display device.

Figure 4A:
FIGS. 4a through 4i schematically illustrate the procedure of the method of fabricating the array substrate according to the embodiments of the present invention.
Figure 4B:
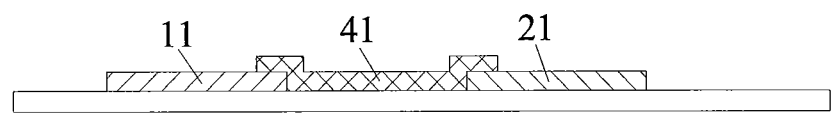
Figure 4C:
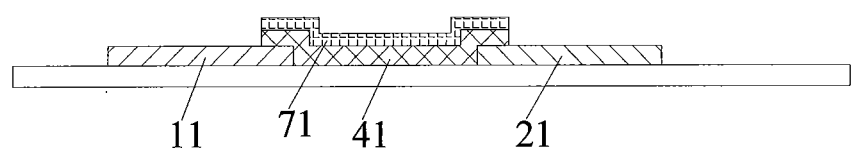
Figure 4D:
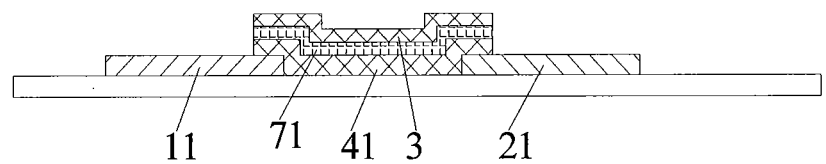
Figure 4E:
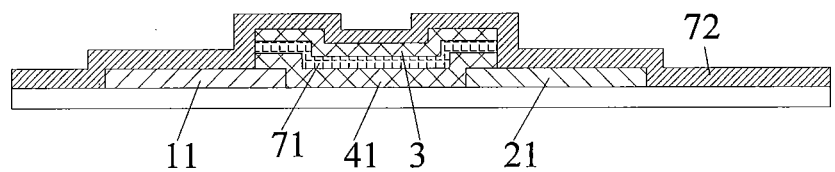
Figure 4F:
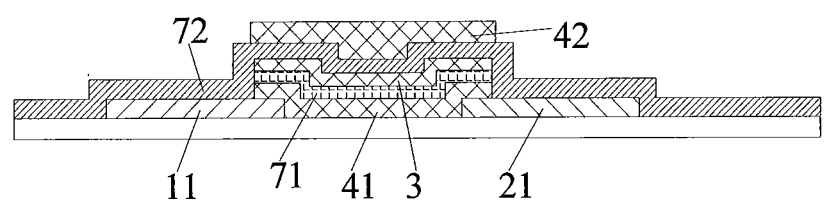
Figure 4G:
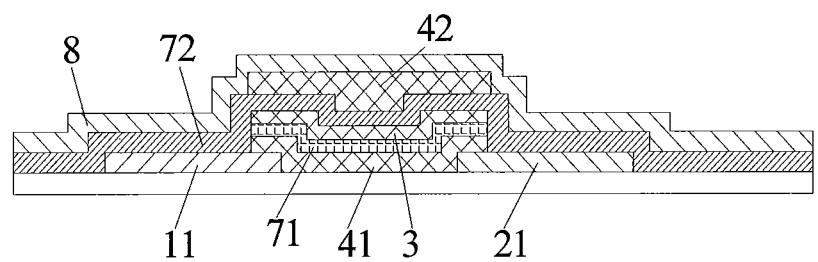
Figure 4H:
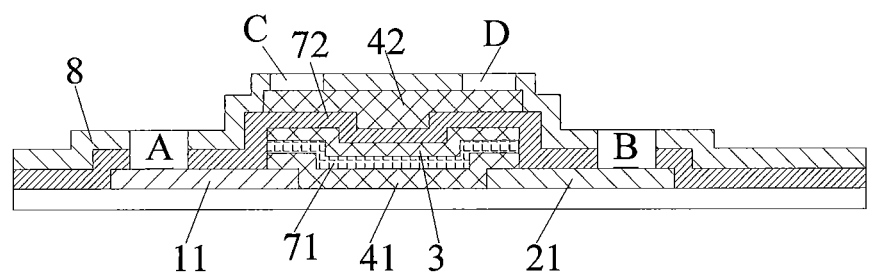
Figure 4I:
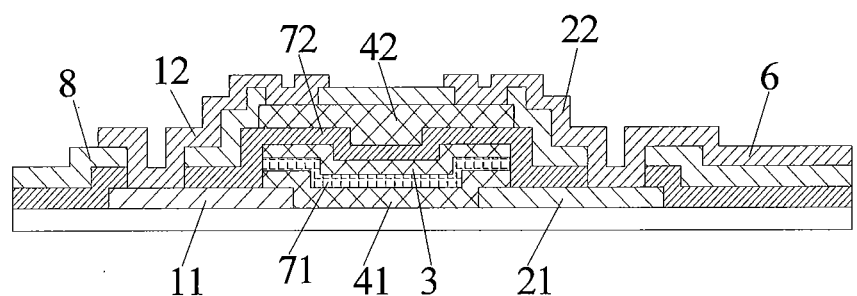

According to another aspect of the embodiments of the present invention, as shown in FIG. 3 and FIGS. 4a through 4i, a method of fabricating the array substrate according to the embodiments of the present invention includes steps of:

forming a pattern comprising a lower source 11 and a lower drain 21 (as shown in FIG. 4a);

forming a pattern comprising a lower active layer 41 (as shown in FIG. 4b);

forming a pattern comprising a gate 3 (as shown in FIG. 4d); forming a pattern comprising an upper active layer 42 (as shown in FIG. 4f;

forming a pattern comprising an upper source 12 and an upper drain 22 (as shown in FIG. 4i); and forming a pattern comprising a pixel electrode 6 (as shown in FIG. 4j).

It should be appreciated that, a gate line of the array substrate may be formed while forming the pattern of the gate 3, and the gate line is electrically connected to the gate 3.

In order to simplify the fabrication process, before the step of forming the pattern comprising the upper source 12 and the upper drain 22, the method further includes a step of forming a first via hole A and a second via hole B, so that the upper source 12 is connected to the lower source 11 through the first via hole A, and the upper drain 22 is connected to the lower drain 21 through the second via hole B.

It should be appreciated that, a data line may be formed while forming the lower source 11 and the lower drain 21, and the data line is electrically connected to the lower source 11, and is also electrically connected to the upper source 12 through the first via hole A.

Further, after the step of forming the pattern comprising the upper active layer 42, and before the step of forming the pattern comprising the upper source 12 and the upper drain 22, the method further includes a step of forming a protective layer 8 which covers the upper active layer 42 (as shown in FIG. 4g). The step of forming the first via hole A and the second via hole B may be performed by a patterning process, after the protective layer 8 is formed.

Further, the pixel electrode 6 may be formed while forming the pattern comprising the upper source 12 and the upper drain 22, and the pixel electrode 6 is electrically connected to both the lower drain 21 and the upper drain 22, i.e., the pixel electrode 6 is electrically connected to the upper drain 22, and is also electrically connected to the lower drain 21 through the second via hole B. For example, the method may further include a step of forming a third via hole C and a fourth via hole D in the protective layer 8 after the step of forming the protective layer 8. The step of forming the pattern comprising the upper source 12 and the upper drain 22 and the step of forming the pattern comprising the pixel electrode 6 are performed simultaneously, so that the upper source 12, the upper drain 22 and the electrode 6 are made of the same material, and the upper source 12 is connected to the upper active layer 42 through the third via hole C and the upper drain 22 is connected to the upper active layer 42 through the fourth via hole D. Typically, the step of forming the first via hole A and the second via hole B and the step of forming the third via hole C and the fourth via hole D may be formed in the same patterning process (as shown in FIG. 4h), after the protective layer 8 is formed. In this case, the upper source 12, the upper drain 22 and the pixel electrode 6 are made of the same material. For example, when the pixel electrode 6 is formed by use of ITO (indium tin oxide), the material of the upper source 12 and the upper drain 22 is also ITO.

As described above, the thin film transistor includes the upper gate insulation layer 72 and the lower gate insulation layer 71. Accordingly, the method according to the embodiments of the present invention further includes: a step of forming the lower gate insulation layer 71 performed between the step of forming the pattern of the lower active layer 41 and the step of forming the pattern comprising the gate 3 (as shown in FIG. 4c); and a step of forming the upper gate insulation layer 72 performed between the step of forming the pattern comprising the gate 3 and the step of forming the upper active layer 42 (as shown in FIG. 4*e*). A method of fabricating the thin film transistor shown in FIG. 2 will be described below.

First, a substrate is provided before the step of forming the pattern comprising the lower source 11 and the lower drain 21.

The step of forming the pattern comprising the lower source 11 and the lower drain 21 includes: depositing a metal layer on the substrate, and then forming the pattern comprising the lower source 11 and the lower drain 21 by photolithograph and etching.

Then, a semiconductor layer (e.g., indium gallium zinc oxide) may be deposited on the substrate on which the lower source 11 and the lower drain 21 are formed, and the pattern of the lower active layer 41 may be formed by wet etching.

Then, material of the gate insulation layer (typically $SiO_2$) may be deposited on the substrate including the lower active layer 41, and the pattern of the gate insulation layer 71 may be formed by dry etching.

Then, a gate metal layer is deposited, and the pattern comprising the gate 3 may be formed by wet etching.

Then, another layer of material of the gate insulation layer may be deposited again, and the pattern of the upper gate insulation layer 72 may be formed by dry etching.

The upper active layer 42 is formed after the pattern of the upper gate insulation layer 72 is formed, the detail of which is similar to that of the lower active layer 41.

The protective layer 8 may be deposited to cover the upper active layer 42, after the upper active layer 42 is formed.

Then, the first via hole A, the second via hole B, the third via hole C and the fourth via hole D may be formed by dry etching, respectively.

Finally, an ITO layer is deposited to form the upper source 12 and the upper drain 22, wherein the upper source 12 is connected to the lower source 11 through the first via hole A and is connected to the upper active layer 42 through the third via hole C; and the upper drain 22 is connected to the lower drain 21 through the second via hole B and is connected to the upper active layer 42 through the fourth via hole D.

It should be appreciated that, the detailed steps of the method of fabricating the thin film transistor according to the embodiments of the present invention are not limited to those described above. For example, the lower semiconductor layer, the material of the gate insulation layer and the gate metal layer may be sequentially deposited, and then the gate, the lower gate insulation layer and the lower active layer may be formed by a patterning process; alternatively, the lower semiconductor layer and the material of the gate insulation layer may be sequentially deposited, and after the lower gate insulation layer and the lower active layer are formed by a patterning process, the gate metal layer may be deposited, and the gate is formed by a patterning process. Similarly, the procedures forming other structures are also not limited to those described above.

In the embodiments of the present invention, the pattering process may include only a photolithograph process, or may include a photolithograph process and an etching step, and may also include other processes for forming predetermined patterns, such as printing and inkjet. The photolithograph process is referred to as a process for forming patterns by utilizing photoresist, mask plate, exposure machine and the like, including a process procedure of film forming, exposure, developing and the like. The corresponding patterning process may be selected based on the structures to be formed in the embodiments of the present invention.

When the thin film transistor according to the embodiments of the present invention is applied to the array substrate, the upper source and the lower source are both connected to the data line of the array substrate, and the upper drain and the lower drain are both connected to the pixel electrode. When the array substrate is powered, the signal from the data line is transmitted via two paths of the upper active layer and the lower active layer, respectively, which is equivalent to the fact that the two general thin film transistors simultaneously charge the pixel electrode. Accordingly, the thin film transistor according to the present invention has relatively high charging capability, so that the time required to charge the pixel electrode can be reduced and the display effect of the display device utilizing the thin film transistor can be improved.

It should be appreciated that the above embodiments are only the exemplary embodiments employed for illustrating the principle of the present invention, but the present invention is not limited thereto. It will be apparent to those skilled in the art that modifications and variations can be made without departing from the spirit and scope of the present invention, and these modifications and variations are also considered to fall within the scope of protection of the present invention.

What is claimed is:

1. A thin film transistor, including a gate, an upper active layer, a lower active layer, an upper source, a lower source, an upper drain and a lower drain,
   wherein the upper active layer and the lower active layer are disposed at an upper side and a lower side of the gate, respectively, the lower source and the lower drain are connected to the lower active layer, respectively, and the upper source and the upper drain are connected to the upper active layer, respectively, and
   wherein the thin film transistor further includes a protective layer that covers the upper active layer, the upper source and the upper drain are disposed on the protective layer, the upper source is connected to the upper active layer through a first via hole, and the upper drain is connected to the upper active layer through a second via hole.

2. The thin film transistor according to claim 1, wherein the upper source is connected to the lower source through a third via hole, and the upper drain is connected to the lower drain through a fourth via hole.

3. The thin film transistor according to claim 2, wherein an upper gate insulation layer is provided between the upper active layer and the gate, and a lower gate insulation layer is provided between the lower active layer and the gate.

4. The thin film transistor according to claim 1, wherein an upper gate insulation layer is provided between the upper active layer and the gate, and a lower gate insulation layer is provided between the lower active layer and the gate.

5. An array substrate, including a plurality of pixel units divided by a plurality of data lines and a plurality of gate lines, a thin film transistor and a pixel electrode connected to the thin film transistor being provided in each of the pixel units,
   wherein the thin film transistor includes a gate, an upper active layer, a lower active layer, an upper source, a lower source, an upper drain and a lower drain; the upper active layer and the lower active layer are disposed at an upper side and a lower side of the gate, respectively, the lower source and the lower drain are connected to the lower active layer, respectively, and the upper source and the upper drain are connected to the upper active layer, respectively, and wherein the pixel electrode is electrically connected to both the upper drain and the lower drain, and the data line is electrically connected to both the upper source and the lower source.

6. The array substrate according to claim 5, wherein the upper drain and the upper source are made of a same material as the pixel electrode.

7. The array substrate according to claim 5, wherein an upper gate insulation layer is provided between the upper active layer and the gate, and a lower gate insulation layer is provided between the lower active layer and the gate.

8. The array substrate according to claim 5, wherein the upper source is connected to the lower source through a first via hole, and the upper drain is connected to the lower drain through a second via hole.

9. The array substrate according to claim 8, wherein the thin film transistor further includes a protective layer that covers the upper active layer, the upper source and the upper drain are disposed on the protective layer, and the upper source is connected to the upper active layer through a third via hole, and the upper drain is connected to the upper active layer through a fourth via hole.

10. A method of fabricating an array substrate, including steps of:

forming a pattern comprising a lower source and a lower drain;

forming a pattern comprising a lower active layer;

forming a pattern comprising a gate;

forming a pattern comprising an upper active layer;

forming a pattern comprising an upper source and an upper drain; and forming a pattern comprising a pixel electrode, the pixel electrode being electrically connected to both the lower drain and the upper drain.

11. The method according to claim 10, wherein the step of forming the pattern comprising the upper source and the upper drain and the step of forming the pattern comprising the pixel electrode are performed simultaneously, so that the upper source and the upper drain are made of a same material as the pixel electrode.

12. The method according to claim 10, wherein before the step of forming the pattern comprising the upper source and the upper drain, the method further includes a step of forming a first via hole and a second via hole, so that the upper source is connected to the lower source through the first via hole, and the upper drain is connected to the lower drain through the second via hole.

13. The method according to claim 12, wherein after the step of forming the pattern comprising the lower active layer, and before the step of forming the pattern comprising the gate, the method further includes a step of forming a lower gate insulation layer, and after the step of forming the pattern comprising the gate, and before the step of forming the pattern comprising the upper active layer, the method further includes a step of forming an upper gate insulation layer.

14. The method according to claim 10, wherein after the step of forming the pattern comprising the upper active layer, and before the step of forming the pattern comprising the upper source and the upper drain, the method further includes a step of forming a protective layer that covers the upper active layer.

15. The method according to claim 14, wherein after the step of forming the protective layer, and before the step of forming the pattern comprising the upper source and the upper drain, the method further includes a step of forming a third via hole and a fourth via hole in the protective layer, so that the upper source is connected to the upper active layer through the third via hole, and the upper drain is connected to the upper active layer through the fourth via hole.

16. The method according to claim 15, wherein after the step of forming the protective layer, and simultaneously with the step of forming the third via hole and the fourth via hole in the protective layer, the method further includes a step of forming a first via hole and a second via hole, so that the upper source is connected to the lower source through the first via hole, and the upper drain is connected to the lower drain through the second via hole.

17. The method according to claim 14, wherein after the step of forming the pattern comprising the lower active layer, and before the step of forming the pattern comprising the gate, the method further includes a step of forming a lower gate insulation layer, and after the step of forming the pattern comprising the gate, and before the step of forming the pattern comprising the upper active layer, the method further includes a step of forming an upper gate insulation layer.

18. The method according to claim 15, wherein after the step of forming the pattern comprising the lower active layer, and before the step of forming the pattern comprising the gate, the method further includes a step of forming a lower gate insulation layer, and after the step of forming the pattern comprising the gate, and before the step of forming the pattern comprising the upper active layer, the method further includes a step of forming an upper gate insulation layer.

19. The method according to claim 10, wherein after the step of forming the pattern comprising the lower active layer, and before the step of forming the pattern comprising the gate, the method further includes a step of forming a lower gate insulation layer, and after the step of forming the pattern comprising the gate, and before the step of forming the pattern comprising the upper active layer, the method further includes a step of forming an upper gate insulation layer.

* * * * *

UNITED STATES PATENT AND TRADEMARK OFFICE
CERTIFICATE OF CORRECTION

| | |
|---|---|
| PATENT NO. | : 9,570,629 B2 |
| APPLICATION NO. | : 14/400128 |
| DATED | : February 14, 2017 |
| INVENTOR(S) | : Jiaxiang Zhang et al. |

Page 1 of 1

It is certified that error appears in the above-identified patent and that said Letters Patent is hereby corrected as shown below:

On the Title Page

(73) Second Assignee: delete "BEIJING BOE OPTOELECTRONICS" and insert --BEIJING BOE OPTOELECTRONICS TECHNOLOGY CO., LTD.--.

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*